US012648327B2

(12) United States Patent
Park et al.

(10) Patent No.: US 12,648,327 B2
(45) Date of Patent: Jun. 2, 2026

(54) DISPLAY DEVICE WITH AIR LAYER DISPOSED IN COLOR FILTER LAYER

(71) Applicant: LG DISPLAY CO., LTD., Seoul (KR)

(72) Inventors: Han-Sun Park, Paju-si (KR); Ho-Jin Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 633 days.

(21) Appl. No.: 18/075,673

(22) Filed: Dec. 6, 2022

(65) Prior Publication Data

US 2023/0217771 A1     Jul. 6, 2023

(30) Foreign Application Priority Data

Dec. 31, 2021     (KR) ........................ 10-2021-0194517

(51) Int. Cl.
| | |
|---|---|
| *H10K 59/38* | (2023.01) |
| *H10K 59/121* | (2023.01) |
| *H10K 59/35* | (2023.01) |
| *H10K 59/80* | (2023.01) |

(52) U.S. Cl.
CPC ......... *H10K 59/38* (2023.02); *H10K 59/1213* (2023.02); *H10K 59/35* (2023.02); *H10K 59/873* (2023.02)

(58) Field of Classification Search
CPC ...................................................... H10K 59/38
USPC ........................................................... 257/40
See application file for complete search history.

(56) References Cited

U.S. PATENT DOCUMENTS

| | | | | |
|---|---|---|---|---|
| 2014/0211105 A1* | 7/2014 | Cho | .................... | G02F 1/13338 156/60 |
| 2017/0294493 A1* | 10/2017 | Yoo | .................... | H10K 59/873 |

| | | | | |
|---|---|---|---|---|
| 2018/0122875 A1 | 5/2018 | Bang et al. | | |
| 2018/0158882 A1* | 6/2018 | Kim | ..................... | H10K 59/122 |
| 2018/0159080 A1 | 6/2018 | Shimoyama et al. | | |
| 2018/0323247 A1* | 11/2018 | Yu | ........................ | H10D 86/425 |
| 2020/0133054 A1 | 4/2020 | Oshige | | |

FOREIGN PATENT DOCUMENTS

| | | |
|---|---|---|
| EP | 4207989 A1 | 7/2023 |
| JP | 2015050096 A | 3/2015 |
| KR | 10-2017-0108294 A | 9/2017 |
| KR | 20180026267 A | 3/2018 |
| KR | 20180047592 A | 5/2018 |
| KR | 20190063618 A | 6/2019 |
| KR | 10-2019-0102381 A | 9/2019 |
| KR | 20200079904 A | 7/2020 |
| KR | 10-2021-0026845 A | 3/2021 |

OTHER PUBLICATIONS

European Search Report dated Jun. 26, 2023 issued in Patent Application No. 22210183.4 (8 pages).
Office Action in Korean Appln. No. 10-2021-0194517, mailed on Aug. 19, 2025, 16 pages (with English translation).
Communication pursuant to Article 94(3) EPC in European Appln. No. 22210183.4, mailed on Dec. 22, 2025, 10 pages.

* cited by examiner

*Primary Examiner* — Ajay Arora

(74) *Attorney, Agent, or Firm* — Fish & Richardson P.C.

(57) ABSTRACT

A display device includes a substrate including first, second and third subpixels, a light emitting diode in each of the first, second and third subpixels disposed on the substrate, a color filter layer disposed on the light emitting diode, the color filter layer including first, second and third color filter patterns in the first, second and third subpixels, respectively, and an air layer in the color filter layer.

13 Claims, 14 Drawing Sheets

DISPLAY DEVICE WITH AIR LAYER DISPOSED IN COLOR FILTER LAYER

CROSS REFERENCE TO RELATED APPLICATION

The present application claims the priority of Korean Application No. 10-2021-0194517 filed on Dec. 31, 2021, which is hereby incorporated by reference in its entirety.

BACKGROUND

Field of the Disclosure

The present disclosure relates to a display device, and more particularly, to a display device where a light efficiency is improved.

Description of the Background

Recently, a flat panel display (FPD) device has been the subject of research and development with the advent of a multimedia. As a result, a flat panel display device such as a liquid crystal display (LCD) device, a plasma display panel (PDP) device and an organic light emitting diode (OLED) display device has been commercialized. Among various FPD devices, the OLED display device has been widely used due to a high response speed, a high luminance and a wide viewing angle.

As a virtual reality and an augmented reality has been highlighted, a demand for a display device having a high resolution and a compact structure has increased. However, it is difficult that the conventional OLED display device satisfies the high resolution and the compact structure.

SUMMARY

Accordingly, the present disclosure is directed to a display device that substantially obviates one or more of the problems due to limitations and disadvantages described above.

More specifically, the present disclosure is to provide a display device where deterioration due to a color mixture with an adjacent subpixel is prevented and a light efficiency is improved.

Additional features and advantages of the present disclosure will be set forth in the description which follows, and in part will be apparent from the description, or may be learned by practice of the disclosure. These and other advantages of the present disclosure will be realized and attained by the structure particularly pointed out in the written description and claims hereof as well as the appended drawings.

To achieve these and other advantages and in accordance with the purpose of the present disclosure, as embodied and broadly described herein, a display device includes: a substrate including first, second and third subpixels; a light emitting diode in each of the first, second and third subpixels on the substrate; a color filter layer on the light emitting diode, the color filter layer including first, second and third color filter patterns in the first, second and third subpixels, respectively; and an air layer in the color filter layer.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the present disclosure and are incorporated in and constitute a part of the present disclosure, illustrate aspects of the present disclosure and together with the description serve to explain the principles of the present disclosure.

In the drawings.

DETAILED DESCRIPTION

Figure 1:
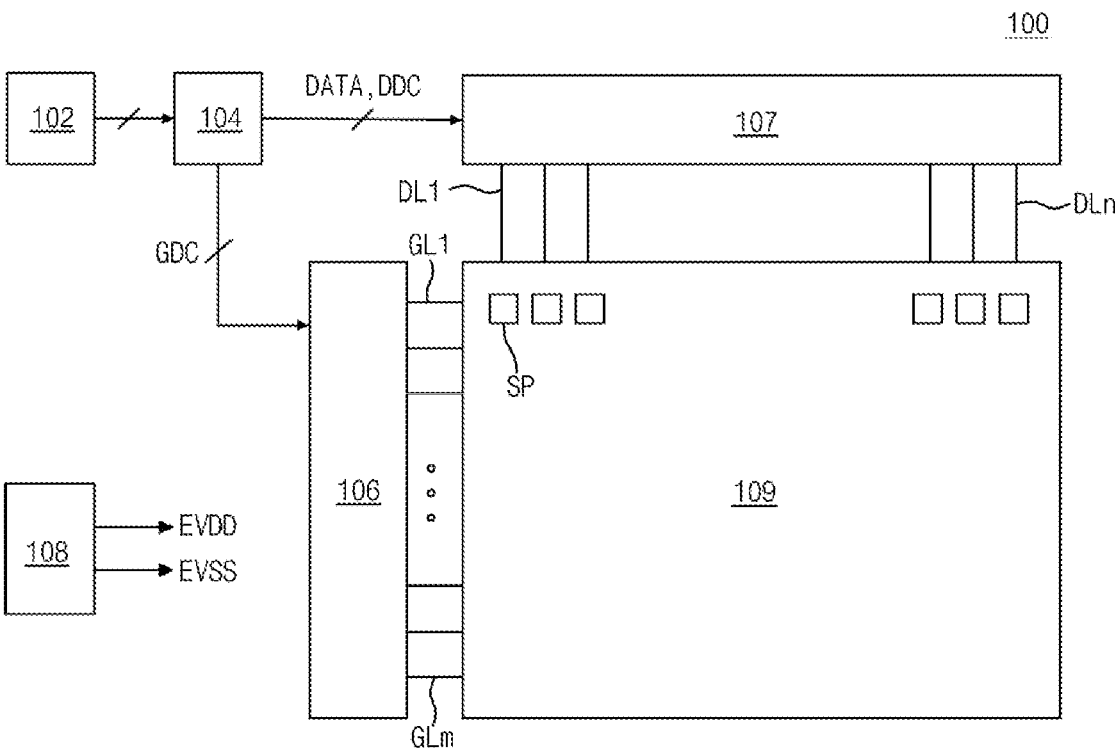
FIG. 1 is a view showing an organic light emitting diode display device according to a first aspect of the present disclosure.

Advantages and features of the present disclosure, and implementation methods thereof will be clarified through following example aspects described with reference to the accompanying drawings. The present disclosure may, however, be embodied in different forms and should not be construed as limited to the example aspects set forth herein.

Rather, these example aspects are provided so that this disclosure may be sufficiently thorough and complete to assist those skilled in the art to fully understand the scope of the present disclosure. Further, the present disclosure is only defined by scopes of claims.

A shape, a size, a ratio, an angle, and a number disclosed in the drawings for describing aspects of the present disclosure are merely an example. Thus, the present disclosure is not limited to the illustrated details. Like reference numerals refer to like elements throughout. In the following description, when the detailed description of the relevant known function or configuration is determined to unnecessarily obscure an important point of the present disclosure, the detailed description of such known function or configuration may be omitted. In a case where terms "comprise," "have," and "include" described in the present specification are used, another part may be added unless a more limiting term, such as "only," is used. The terms of a singular form may include plural forms unless referred to the contrary.

In construing an element, the element is construed as including an error or tolerance range even where no explicit description of such an error or tolerance range.

In describing a position relationship, when a position relation between two parts is described as, for example, "on," "over," "under," or "next," one or more other parts may be disposed between the two parts unless a more limiting term, such as "just" or "direct(ly)," is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various aspects of the present disclosure may be partially or overall coupled to or combined with each other, and may be variously inter-operated with each other and driven technically as those skilled in the art can sufficiently understand. Aspects of the present disclosure may be carried out independently from each other, or may be carried out together in co-dependent relationship.

Hereinafter, a display device according to aspects of the present disclosure will be described in detail with reference to the accompanying drawings. In the following description, like reference numerals designate like elements throughout. When a detailed description of well-known functions or configurations related to this document is determined to unnecessarily cloud a gist of the inventive concept, the detailed description thereof will be omitted or will be made brief.

The present disclosure may be applied to various display devices. For example, although the present disclosure may be applied to various display devices such as an organic light emitting diode display device and an electrophoretic display device, the organic light emitting diode display device will be exemplarily illustrated hereinafter.

Figure 2:
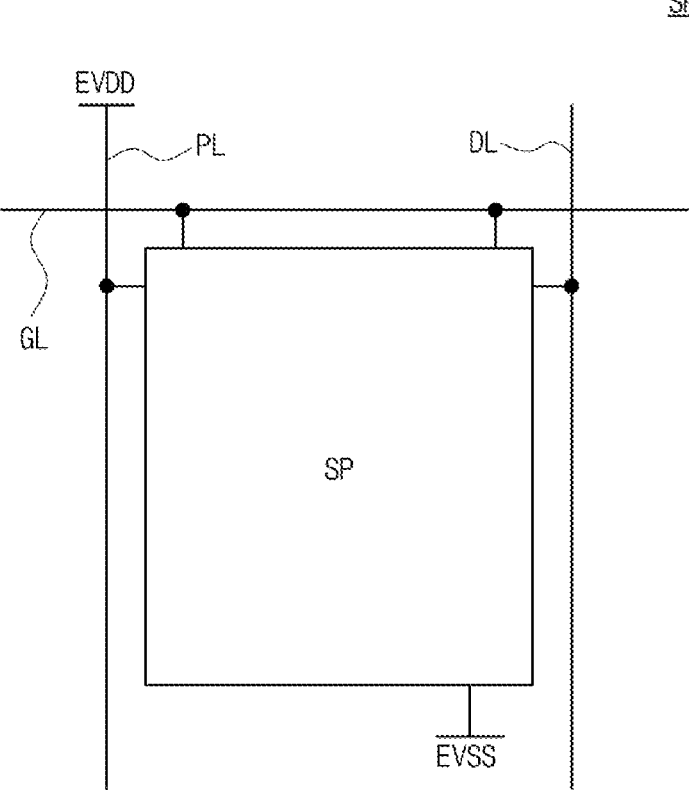
FIG. 2 is a view showing a subpixel of an organic light emitting diode display device according to a first aspect of the present disclosure.

FIG. 1 is a view showing an organic light emitting diode display device according to a first aspect of the present disclosure, and FIG. 2 is a view showing a subpixel of an organic light emitting diode display device according to a first aspect of the present disclosure.

In FIG. 1, an organic light emitting diode (OLED) display device 100 according to a first aspect of the present disclosure includes an image processing unit 102, a timing controlling unit 104, a gate driving unit 106, a data driving unit 107, a power supplying unit 108 and a display panel 109.

The image processing unit 102 outputs an image signal and a plurality of timing signals. For example, the plurality of timing signals outputted from the image processing unit 102 may include a data enable signal, a vertical synchronization signal, a horizontal synchronization signal and a clock signal.

The timing controlling unit 104 receives the image signal and the plurality of timing signals. The timing controlling unit 104 generates and outputs a gate control signal GDC for controlling the gate driving unit 106 and a data control signal DDC for controlling the data driving unit 107 based on the plurality of timing signals of the image processing unit 102. The timing controlling unit 104 generates and outputs an image data DATA by rearranging the image signal according to the plurality of timing signals.

The gate driving unit 106 outputs a gate signal (gate voltage) to a plurality of gate lines GL1 to GLm of the display panel 109 in response to the gate control signal GDC supplied from the timing controlling unit 104. Although the gate driving unit 106 may have an integrated circuit (IC) shape, it is not limited thereto.

The data driving unit 107 outputs a data signal (data voltage) to a plurality of data lines DL1 to DLn of the display panel 109 in response to the data control signal DDC and the image data DATA. The data driving unit 107 may convert the image data DATA of a digital type supplied from the timing controlling unit 104 into the data signal of an analog type based on a gamma voltage through a sampling and a latch. Although the data driving unit 107 may have an integrated circuit (IC) shape, it is not limited thereto.

The power supplying unit 108 outputs a plurality of voltages including a high level voltage EVDD and a low level voltage EVSS and supplies the plurality of voltages to the display panel 109. The high level voltage EVDD is supplied to the display panel 109 through a power line PL (of FIG. 3). The plurality of voltages outputted from the power suppling unit 108 are supplied to the gate driving unit 106 or the data driving unit 107.

The display panel 109 displays an image in response to the gate signal and the data signal supplied from the gate driving unit 106 and the data driving unit 107 and the plurality of voltages supplied from the power supplying unit 108.

The display panel 109 includes a plurality of subpixels SP to display an image. The plurality of subpixels SP may include a red subpixel, a green subpixel and a blue subpixel or a white subpixel, a red subpixel, a green subpixel and a blue subpixel. Although the white, red, green and blue subpixels may have the same area as each other, it is not limited thereto.

In FIG. 2, one subpixel SP may be connected to a gate line GL, a data line DL and a power line PL. A driving method as well as the number of transistors and the number of capacitors may be determined according to a pixel circuit of the subpixel SP.

Figure 3:
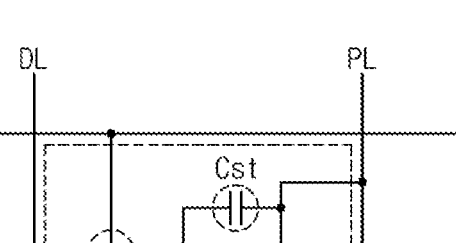
FIG. 3 is a view showing a pixel circuit of a subpixel of an organic light emitting diode display device according to a first aspect of the present disclosure.

FIG. 3 is a view showing a pixel circuit of a subpixel of an organic light emitting diode display device according to a first aspect of the present disclosure.

In FIG. 3, the gate line GL, the data line DL and the power line PL cross each other to define the subpixel SP, and a switching transistor Ts, a driving transistor Td, a storage capacitor Cst and a light emitting diode D are disposed in the subpixel SP.

The switching transistor Ts is connected to the gate line GL and the data line DL, the driving transistor Td and the storage capacitor Cst are connected between the switching transistor Ts and the power line PL, and the light emitting diode D is connected to the driving transistor Td.

In the OLED display device, when the switching transistor Ts is turned on according to the gate signal of the gate line GL, the data signal of the data line DL is applied to a gate electrode of the driving transistor Td and an electrode of the storage capacitor Cst through the switching transistor Ts.

The driving transistor Td is turned on according to the data signal applied to the gate electrode of the driving transistor Td. As a result, a current proportional to the data signal flows in the light emitting diode D from the power line PL through the driving transistor Td, and the light emitting diode D emits a light of a luminance proportional to the current of the driving transistor Td.

The storage capacitor Cst is charged with a voltage proportional to the data signal to keep a voltage of the gate electrode of the driving transistor Td constant during a frame.

Although the subpixel SP includes two transistors of the switching transistor Ts and the driving transistor Td and one capacitor of the storage capacitor Cst in a first aspect, the subpixel SP may include three or more transistors and two or more capacitors in another aspect.

Figure 4:
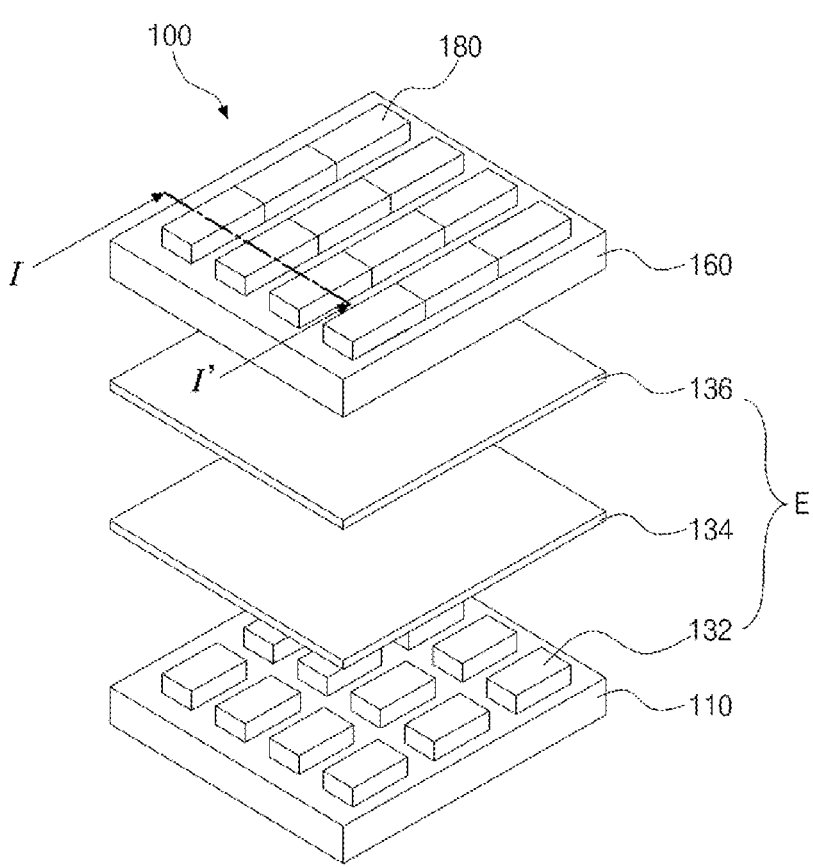
FIG. 4 is a perspective view showing an organic light emitting diode display device according to a first aspect of the present disclosure.

FIG. 4 is a perspective view showing an organic light emitting diode display device according to a first aspect of the present disclosure.

Although the OLED display device 100 according to a first aspect of the present disclosure may have various structures, an organic light emitting diode on silicon (OLE-DoS) structure where a light emitting diode is disposed on a silicon wafer through a semiconductor process will be exemplarily illustrated hereinafter. However, it is not limited thereto.

In FIG. 4, an organic light emitting diode display device 100 according to a first aspect of the present disclosure includes a wafer substrate 110, a first electrode 132, an emitting layer 134, a second electrode 136, an encapsulating layer 160 and a color filter layer 180.

The first electrode 132, the emitting layer 134 and the second electrode 136 constitute a light emitting diode E.

The wafer substrate 110 may include a silicon wafer through a semiconductor process. An active layer may be disposed in the wafer substrate 110, and the gate line, the data line and electrodes of the transistor may be disposed on the wafer substrate 110.

The first electrode 132, the emitting layer 132 and the second electrode 136 are sequentially disposed on the wafer substrate 110 to constitute a light emitting diode E. The first electrodes 132 are spaced apart from each other and disposed in the red subpixel, the green subpixel and the blue subpixel.

The emitting layer 134 is disposed on the entire wafer substrate 110 to cover the wafer substrate 110 and the first electrode 132. The emitting layer 134 is commonly disposed in the red, green and blue subpixels to emit a white colored light.

The second electrode 136 is disposed on the emitting layer 134. The second electrode 136 is disposed in the entire subpixels to supply a signal to the subpixels at the same time.

The encapsulating layer 160 is disposed on the second electrode 136 to prevent permeation of an oxygen or a moisture into the light emitting diode E. The encapsulating layer 160 may have a plurality of layers of inorganic and organic materials.

The color filter layer 180 is disposed on the encapsulating layer 160. The color filter layer 180 may include a red color filter pattern, a green color filter pattern and a blue color filter pattern.

In the OLED display device 100 of the OLEDoS structure according to a first aspect of the present disclosure, since the active layer is disposed in the wafer substrate 110, a transistor of a single crystalline silicon having an excellent mobility is obtained. As a result, a size of the subpixel is reduced and a display device of a relatively high resolution is obtained.

Further, since transistors in the gate driving unit and the data driving unit as well as the transistor in the subpixel include a single crystalline silicon, a relatively rapid response speed is obtained.

The OLED display device 100 of an OLEDoS structure may be applied to various fields. For example, the OLED display device 100 of an OLEDoS structure may be applied to a device for a metaverse of a virtual world based on a virtual reality and an augmented reality that have been recently highlighted.

Figure 5:
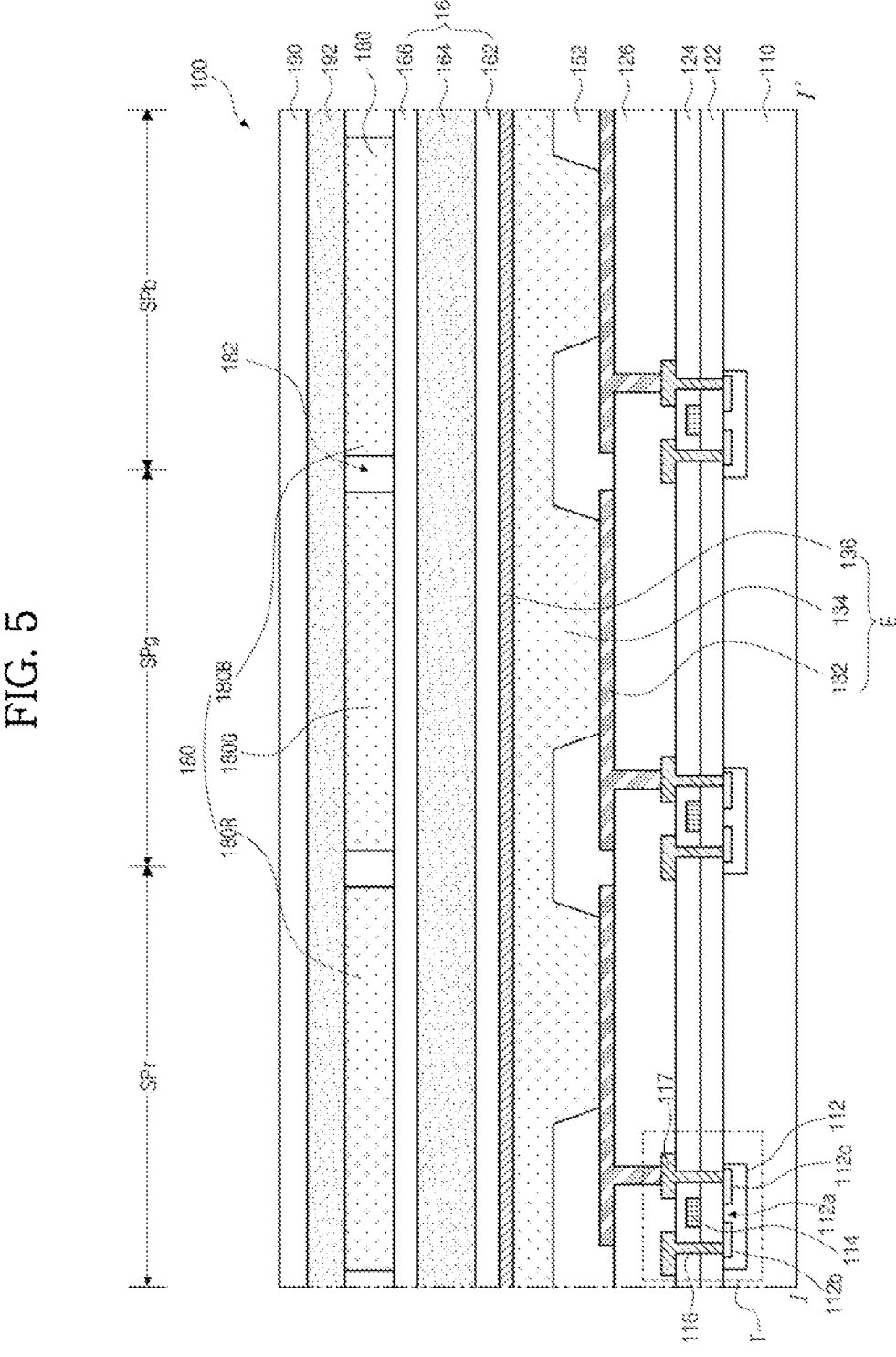
FIG. 5 is a cross-sectional view, which is taken along a line I-I' of FIG. 4, showing an organic light emitting diode display device according to a first aspect of the present disclosure.

FIG. 5 is a cross-sectional view, which is taken along a line I-I' of FIG. 4, showing an organic light emitting diode display device according to a first aspect of the present disclosure.

In FIG. 5, the OLED display device 100 according to a first aspect of the present disclosure includes a transistor T in each of the red, green and blue subpixels SPr (or first subpixel), SPg (or second subpixel) and SPb (or third subpixel) on the wafer substrate 110.

The transistor T includes an active layer 112 in the wafer substrate 110, a gate insulating layer 122 on the wafer substrate 110, a gate electrode 114 on the gate insulating layer 122, an interlayer insulating layer 124 on the gate electrode 114 over the gate insulating layer 122 and source and drain electrodes 116 and 117 on the interlayer insulating layer 124.

The wafer substrate 110 may be a single crystalline silicon wafer formed by growing silicon (Si), it is not limited thereto. However, it is not limited thereto. For example, the wafer substrate 110 may be a wafer including various semiconductor materials.

The active layer 112 may be formed inside the wafer substrate 110 and may be partially doped with an impurity. As a result, the active layer 112 may have a channel region 112a not doped with an impurity and at a central portion thereof and source and drain regions 112b and 112c doped with an impurity and at both sides of the channel region 112a.

The gate insulating layer 122 may have a single layer or a multiple layer including an inorganic material such as silicon oxide (SiOx) and silicon nitride (SiNx). However, it is not limited thereto.

The interlayer insulating layer 124 may have a single layer or a multiple layer including an inorganic material such as silicon oxide (SiOx) and silicon nitride (SiNx), or an organic material such as photoacryl. Alternatively, the interlayer insulating layer 124 may have a multiple layer of an organic material layer and an inorganic material layer.

The source and drain electrodes 116 and 117 may have a single layer or a multiple layer including a metallic material such as chromium (Cr), molybdenum (Mo), tantalum (Ta), copper (Cu), titanium (Ti), aluminum (Al) and aluminum alloy. However, it is not limited thereto.

The source and drain electrodes 116 and 117 are connected to the source and drain regions 112b and 112c, respectively, of the active layer 112 through contact holes in the gate insulating layer 122 and the interlayer insulating layer 124. (ohmic contact)

A passivation layer 126 may be disposed on the transistor T over the wafer substrate 110. Although the passivation layer 126 may include an organic material such as photoacryl, it is not limited thereto.

A bank layer 152 is disposed at a boundary portion of each subpixel. The bank layer 152 may be a sidewall defining the subpixel. The bank layer 152 may divide each subpixel to prevent a mixture of colored lights emitted from adjacent subpixels.

The light emitting diode E is disposed on the passivation layer 126 and is connected to the drain electrode 117 of the transistor T through a contact hole in the passivation layer 126.

The light emitting diode E includes a first electrode 132, an emitting layer 134 and a second electrode 136. The first electrode 132 is exposed through an opening of the bank layer 152 and is connected to the drain electrode 117 of the transistor T through a contact hole in the passivation layer 126. The emitting layer 134 is disposed on the first electrode 132 and the bank layer 152, and the second electrode 136 is disposed on the emitting layer 134.

The first electrode 132 may include a transparent conductive material such as indium tin oxide (ITO) and indium zinc oxide (IZO) or a metallic material of a relatively thin thickness. However, it is not limited thereto. The first electrode 132 is connected to the drain electrode 117 of the transistor T, and a voltage corresponding to the image signal may be applied to the first electrode 132.

When the first electrode 132 includes a transparent metal oxide, a reflective electrode including a metallic material having a relatively high reflectance such as aluminum (Al) and silver (Ag) may be disposed under the first electrode 132. The reflective electrode may reflect a light incident to the first electrode 132 to improve a light efficiency.

The first electrode 132 is disposed in each subpixel, and a voltage corresponding to the image signal is applied to the first electrode 132 of each subpixel.

The emitting layer 134 on the first electrode 132 and the bank layer 152 may include at least one of a hole injecting layer, a hole transporting layer, an emitting material layer, an electron transporting layer, and an electron injecting layer.

The emitting layer 134 may be a white emitting layer which emits a white colored light and is disposed on the entire display device 100. The emitting layer 134 may have a tandem structure having at least two stacks. Each stack may include a hole transporting layer, an emitting material layer and an electron transporting layer.

The emitting material layer may have a tandem structure of a plurality of partial emitting material layers. For example, the emitting material layer may include a red partial emitting material layer, a green partial emitting material layer and a blue partial material layer of a tandem structure, and a white colored light may be emitted from the emitting material layer by mixing red, green and blue colored lights emitted from the red, green and blue partial emitting material layers. A hole transporting layer, an electron transporting layer and a charge generating layer may be disposed between the plurality of partial emitting material layers.

Further, the emitting material layer may include a yellow-green partial emitting material layer and a blue partial emitting material layer of a tandem structure, and a white colored light may be emitted from the emitting material layer by mixing yellow-green and blue lights emitted from the yellow-green and blue partial emitting material layers.

In the OLED display device 100 according to a first aspect of the present disclosure, the emitting layer for emitting a white colored light may have various structures other than the above structures. The emitting layer 134 may be formed on the entire wafer substrate 110 through a deposition process or a soluble process.

The second electrode 136 may have a single layer or a multiple layer including a metallic material such as calcium (Ca), barium (Ba), magnesium (Mg), aluminum (Al) and silver (Ag) or an alloy thereof. However, it is not limited thereto.

When a voltage is applied to the first and second electrodes 132 and 136 of the light emitting diode E, a hole and an electron are transmitted to the emitting layer 134 through the hole transporting layer and the electron transporting layer and are combined with each other to emit a light.

The encapsulating layer 160 is disposed on the second electrode 136. The encapsulating layer 160 may include a first encapsulating layer 162 of an inorganic material, a second encapsulating layer 164 of an organic material and a third encapsulating layer 166 of an inorganic material. Although the inorganic material may include silicon nitride (SiNx) and silicon oxide (SiOx), it is not limited thereto. The organic material may include polyethylene terephthalate, polyethylene naphthalate, polycarbonate, polyimide, polyethylene sulfonate, polyoxymethylene, polyacrylate or a compound thereof. However, it is not limited thereto.

In the OLED display device 100 according to a first aspect of the present disclosure, the encapsulating layer 160 may have various structures other than the above structure of a triple layer. For example, the encapsulating layer 160 may have a double layer of an inorganic layer and an organic layer, or a multiple layer of four or more layers.

The color filter layer 180 is disposed on the encapsulating layer 160. The color filter layer 180 includes red, green and blue color filter patterns 180R, 180G and 180B in the red, green and blue subpixels SPr, SPg and SPb, respectively. The color filter layer 180 may include a resin such as a color resist. However, it is not limited thereto.

A vacant space where the red, green and blue color filter patterns 180R, 180G and 180B are not formed, i.e., an air layer 182 filled with an air, is disposed in a boundary portion of the red, green and blue subpixels SPr, SPg and SPb between the red, green and blue color filter patterns 180R, 180G and 180B. Although the color filter layer 180 includes the red, green and blue color filter patterns 180R, 180G and 180B, the air layer 182 may be regarded as a portion of the color filter layer 180.

The red color filter pattern 180R absorbs a light of a wavelength band other than a wavelength of the red colored light among the white colored light emitted from the light emitting diode E to output the red colored light. The green color filter pattern 180G absorbs a light of a wavelength band other than a wavelength of the green colored light among the white colored light emitted from the light emitting diode E to output the green colored light, and the blue color filter pattern 180B absorbs a light of a wavelength band other than a wavelength of the blue colored light among the white colored light emitted from the light emitting diode E to output the blue colored light.

An adhesive layer 192 is disposed on the color filter layer 180, and a protecting layer 190 is disposed on the adhesive layer 192 such that the protecting layer 190 is attached to the color filter layer 180 due to the adhesive layer 192.

The protecting layer 190 protects the OLED display device 100. For example, the protecting layer 190 may include a glass or a transparent film. The transparent film may include one of a polystyrene (PS) film, a polyethylene (PE) film, a polyethylene naphthalate (PEN) film and a polyimide (PI) film.

The adhesive layer 192 may include an optical clear adhesive (OCA). The OCA may have a shape of a double-sided tape, and a release film may be disposed on both sides of the OCA. After the release film is detached from the OCA, objects may be attached to both sides of the OCA. As a result, the objects may be attached to each other due to the OCA. Since the OCA is disposed between the color filter layer 180 and the protecting layer 190 as a semisolid state, an adhesive material does not flow into the air layer 182 such that the same shape of the color filter layer 180 is maintained.

The adhesive layer 192 is not limited to the OCA, and various adhesive materials may be used for the adhesive layer 192.

In the OLED display device 100 according to a first aspect of the present disclosure, since the transistor T is formed on the wafer substrate 110 of a single crystalline semiconductor material instead of a glass or a plastic film, an image of a relatively high quality is obtained even when a size of the subpixel is reduced. As a result, the OLED display device 100 of a high resolution is obtained.

Further, since a black matrix for preventing a light leakage is not disposed between the subpixels SPr, SPg and SPb, a size of the subpixel is reduced. As a result, the OLED display device 100 of an ultra high resolution is obtained.

In addition, since the air layer 182 is disposed between the red, green and blue color filter patterns 180R, 180G and 180B of the color filter layer 180, a light efficiency of the red, green and blue subpixels SPr, SPg and SPb is improved.

Figure 6:
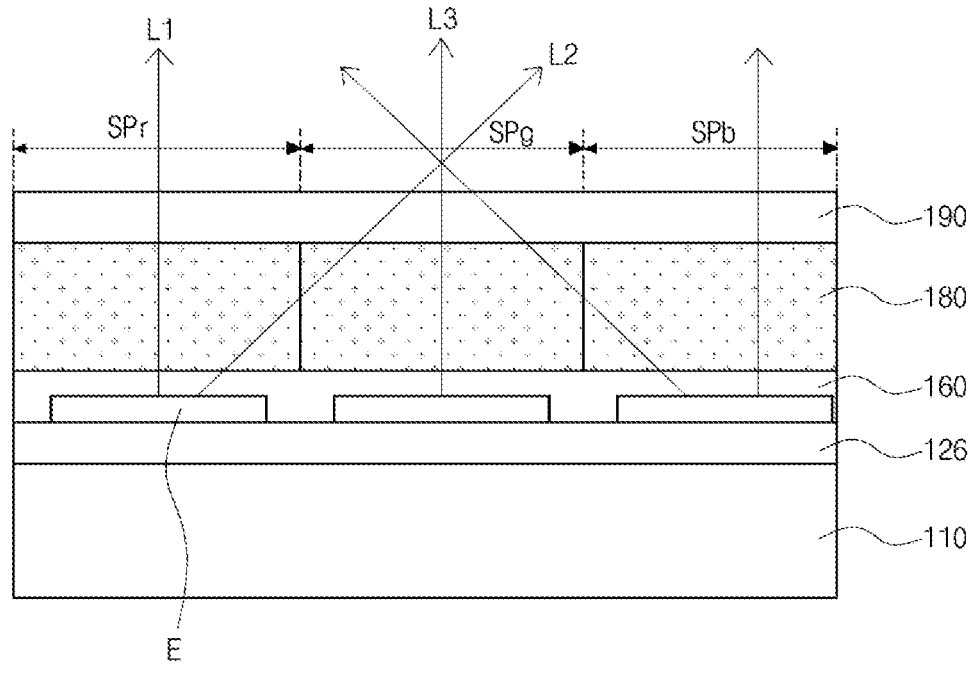
FIG. 6 is a cross-sectional view showing a light path in an organic light emitting diode display device according to a comparison example.

FIG. 6 is a cross-sectional view showing a light path in an organic light emitting diode display device according to a comparison example.

In FIG. 6, the color filter layer 180 includes the red, green and blue color filter patterns, and an air layer is not disposed between red, green and blue color filter patterns. The white colored light emitted from the light emitting diode E of the red, green and blue subpixels SPr, SPg and SPb is outputted through the color filter layer 180. The red color filter pattern absorbs a light of a wavelength band other than a wavelength of the red colored light among the white colored light to output the red colored light. The green color filter pattern absorbs a light of a wavelength band other than a wavelength of the green colored light among the white colored light to output the green colored light, and the blue color filter pattern absorbs a light of a wavelength band other than a wavelength of the blue colored light among the white colored light to output the blue colored light.

Since the black matrix is not disposed between the red, green and blue color filter patterns, the light emitted from the light emitting diode E of the subpixel may be outputted through the different subpixel.

For example, first and third lights L1 and L3 perpendicularly emitted from the light emitting diodes E of the red and green subpixels SPr and SPg may be outputted intactly from the red and green subpixels SPr and SPg, respectively.

The red, green and blue color filter patterns have similar refractive indexes to each other, and the red, green and blue color filter patterns contact each other at an interface between the red, green and blue subpixels. As a result, a light obliquely emitted from the light emitting diode E enters the adjacent subpixel without refraction through the interface between the red, green and blue color filter patterns and is outputted from the adjacent subpixel.

For example, a second light L2 obliquely emitted from the light emitting diode E of the red subpixel SPr may enter the green color filter pattern without refraction and reflection through the interface between the red and green color filter patterns and may be outputted from the green subpixel SPg. All of the lights emitted from the light emitting diode E of the red subpixel SPr are not outputted from the red subpixel SPr through the red color filter pattern, and a part of the lights emitted from the light emitting diode E of the red subpixel SPr is outputted from the green subpixel SPg through the green color filter pattern. As a result, the red colored light and the green colored light are mixed in the green subpixel SPg to cause a stain due to a light leakage in the image.

Further, since a part of the light emitted from the subpixel is outputted from the adjacent subpixel, an intensity of the light outputted from the subpixel is reduced and a light efficiency of the OLED display device 100 is reduced.

Figure 7:
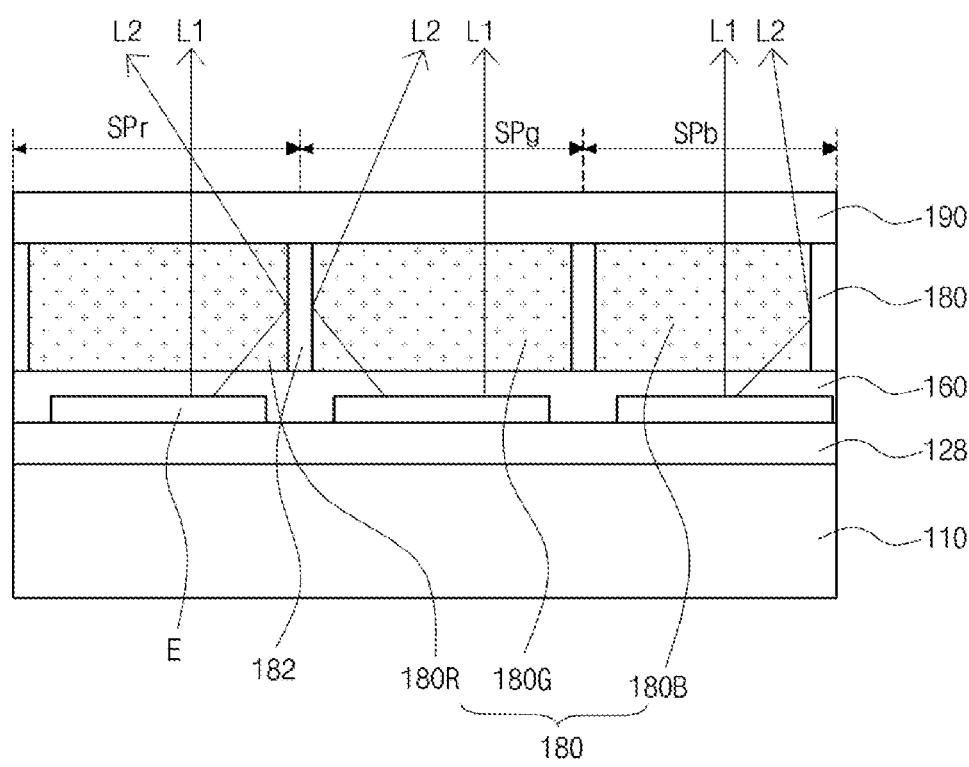
FIG. 7 is a cross-sectional view showing a light path in an organic light emitting diode display device according to a first aspect of the present disclosure.

FIG. 7 is a cross-sectional view showing a light path in an organic light emitting diode display device according to a first aspect of the present disclosure.

In FIG. 7, the color filter layer 180 includes the red, green and blue color filter patterns 180R, 180G and 180B in the red, green and blue subpixels SPr, SPg and SPb, respectively, and the red, green and blue color filter patterns 180R, 180G and 180B are spaced apart from each other such that the air layer 182 is disposed between the red, green and blue color filter patterns 180R, 180G and 180B.

In the OLED display device 100 according to a first aspect of the present disclosure, the white colored light emitted from the light emitting diode E of the red, green and blue subpixels SPr, SPg and SPb is outputted through the color filter layer 180. For example, the red color filter pattern 180R may absorb a light of a wavelength band other than a wavelength of the red colored light among the white colored light to output the red colored light. The green color filter pattern 180G may absorb a light of a wavelength band other than a wavelength of the green colored light among the white colored light to output the green colored light, and the blue color filter pattern 180B may absorb a light of a wavelength band other than a wavelength of the blue colored light among the white colored light to output the blue colored light.

First lights L1 perpendicularly emitted from the light emitting diode E of the red, green and blue subpixels SPr, SPg and SPb may be outputted through the red, green and blue color filter patterns 180R, 180G and 180B, respectively.

Second lights L2 obliquely emitted from the light emitting diode E of the red, green and blue subpixels SPr, SPg and SPb may pass through the red, green and blue color filter patterns 180R, 180G and 180B to reach a side surface of the red, green and blue color filter patterns 180R, 180G and 180B, respectively. The air layer 182 is disposed between the red, green and blue color filter patterns 180R, 180G and 180B to contact the side surface of the red, green and blue color filter patterns 180R, 180G and 180B.

Since a refractive index of an organic material of the color filter layer 180 is greater than a refractive index of an air of the air layer 182, the second lights L2 reaching the side surface of the red, green and blue color filter patterns 180R, 180G and 180B do not pass through the air layer 182 and are totally reflected at the side surface of the red, green and blue color filter patterns 180R, 180G and 180B. As a result, the second lights L2 totally reflected at the side surface of the red, green and blue color filter patterns 180R, 180G and 180B are outputted from the red, green and blue subpixels SPr, SPg and SPb.

For example, the second light L2 obliquely emitted from the light emitting diode E of the red subpixel SPr may pass through the red color filter pattern 180R to reach the side surface of the red color filter pattern 180R and may be totally reflected at the side surface of the red color filter pattern 180R to be outputted through a top surface of the red color filter pattern 180R. Similarly, the second light L2 obliquely emitted from the light emitting diode E of the green subpixel SPg may pass through the green color filter pattern 180G to reach the side surface of the green color filter pattern 180G and may be totally reflected at the side surface of the green color filter pattern 180G to be outputted through a top surface of the green color filter pattern 180G. Further, the second light L2 obliquely emitted from the light emitting diode E of the blue subpixel SPb may pass through the blue color filter pattern 180B to reach the side surface of the blue color filter pattern 180B and may be totally reflected at the side surface of the blue color filter pattern 180B to be outputted through a top surface of the blue color filter pattern 180B.

Accordingly, in the OLED display device 100 according to a first aspect of the present disclosure, since the light emitted from the light emitting diode E of the subpixel does not permeate into the adjacent subpixel and is outputted through the corresponding color filter pattern, deterioration due to a color mixture of the adjacent subpixels is prevented and a luminance of the corresponding subpixel increases.

Figure 8A:
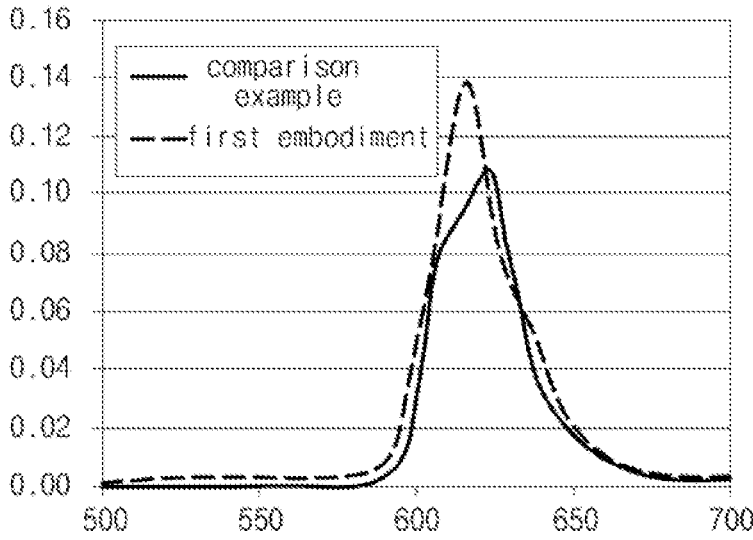
FIG. 8A is graph showing an emission spectrum of a red subpixel of an organic light emitting diode display device according to a first aspect of the present disclosure and an emission spectrum of a red subpixel of an organic light emitting diode display device according to a comparison example.
Figure 8B:
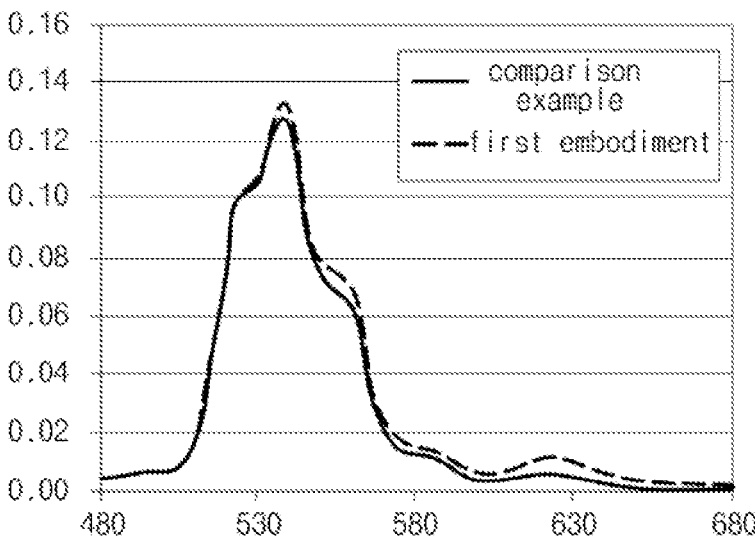
FIG. 8B is a graph showing an emission spectrum of a green subpixel of an organic light emitting diode display device according to a first aspect of the present disclosure and an emission spectrum of a green subpixel of an organic light emitting diode display device according to a comparison example.
Figure 8C:
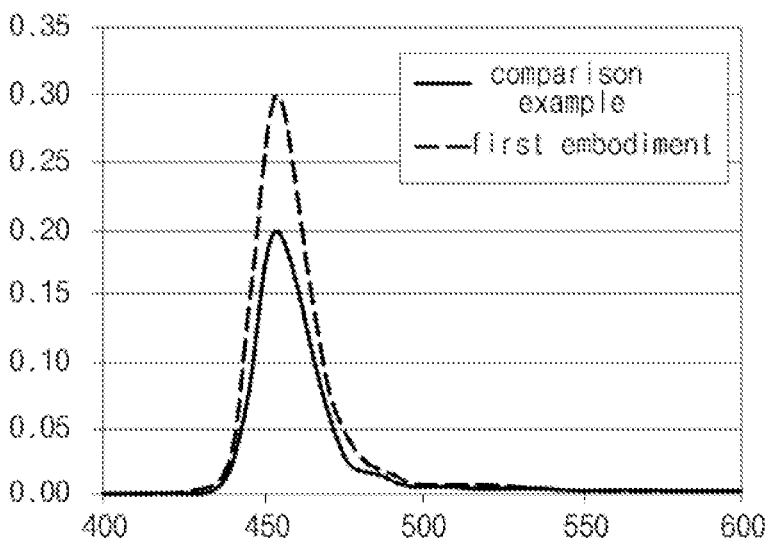
FIG. 8C is a graph showing an emission spectrum of a blue subpixel of an organic light emitting diode display device according to a first aspect of the present disclosure and an emission spectrum of a blue subpixel of an organic light emitting diode display device according to a comparison example.

FIGS. 8A to 8C are graphs showing an emission spectrum of red, green and blue subpixels of an organic light emitting diode display device according to a first aspect of the present disclosure and an emission spectrum of red, green and blue subpixels of an organic light emitting diode display device according to a comparison example. The air layer 182 is disposed between the red, green and blue color filter patterns 180R, 180G and 180B in the OLED display device 100 according to a first aspect of the present disclosure, and the air layer is not disposed between the red, green and blue color filter patterns in the OLED display device according to a comparison example.

In FIG. 8A, while the red colored light outputted from the red subpixel has an intensity of about 0.11 in a comparison example without the air layer, the red colored light outputted from the red subpixel SPr has an intensity of about 0.14 in a first aspect with the air layer 182. As a result, while the red colored light through the red subpixel has an efficiency of about 9.7 cd/A in a comparison example without the air layer, the red colored light through the red subpixel SPr has an efficiency of about 13.6 cd/A in a first aspect with the air layer 182. The efficiency of the red colored light of a first aspect increases by about 40.2% as compared with the efficiency of the red colored light of a comparison example.

In FIG. 8B, while the green colored light outputted from the green subpixel has an intensity of about 0.13 in a comparison example without the air layer, the green colored light outputted from the green subpixel SPg has an intensity of about 0.136 in a first aspect with the air layer 182. As a result, while the green colored light through the green subpixel has an efficiency of about 40.4 cd/A in a comparison example without the air layer, the green colored light through the green subpixel SPg has an efficiency of about 42.8 cd/A in a first aspect with the air layer 182. The efficiency of the green colored light of a first aspect increases by about 5.9% as compared with the efficiency of the green colored light of a comparison example.

In FIG. 8C, while the blue colored light outputted from the blue subpixel has an intensity of about 0.20 in a comparison example without the air layer, the blue colored light outputted from the blue subpixel SPb has an intensity of about 0.30 in a first aspect with the air layer 182. As a result, while the blue colored light through the blue subpixel has an efficiency of about 2.8 cd/A in a comparison example without the air layer, the blue colored light through the blue subpixel SPb has an efficiency of about 5.2 cd/A in a first aspect with the air layer 182. The efficiency of the blue colored light of a first aspect increases by about 85.7% as compared with the efficiency of the blue colored light of a comparison example.

In the OLED display device 100 according to a first aspect of the present disclosure, the light emitted from the light emitting diode E of the subpixel and reaching the side surface of the corresponding color filter pattern is totally reflected at the side surface and is outputted through a top surface of the corresponding color filter pattern. As a result, the intensity and the efficiency of the red, green and blue colored lights are improved.

Further, since the air layer 182 is disposed between the red, green and blue color filter patterns 180R, 180G and 180B, widths of the red, green and blue color filter patterns 180R, 180G and 180B are reduced. However, deterioration such as a light leakage due to reduction of the widths of the red, green and blue color filter patterns 180R, 180G and 180B is not caused.

Figure 9:
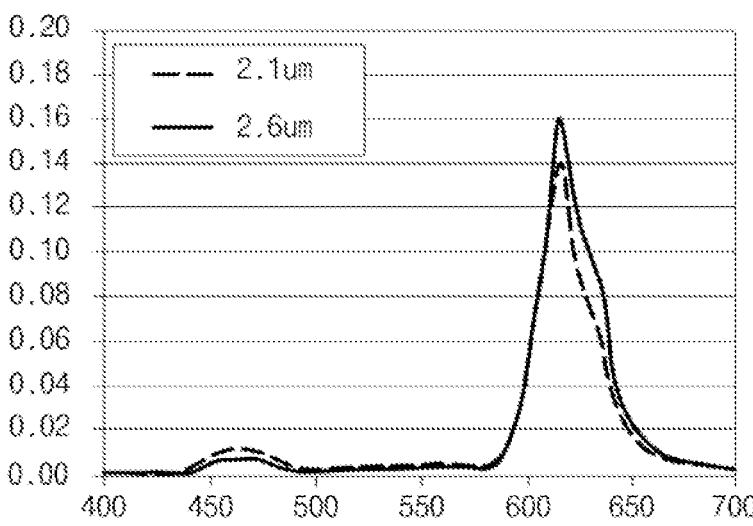
FIG. 9 is a graph showing an emission spectrum with respect to a width of a color filter pattern of an organic light emitting diode display device according to a first aspect of the present disclosure.

FIG. 9 is a graph showing an emission spectrum with respect to a width of a color filter pattern of an organic light emitting diode display device according to a first aspect of the present disclosure. Since intensity variations according to widths of the red, green and blue color filter patterns 180R, 180G and 180B are the same as each other, the red color filter pattern 180R is exemplarily illustrated.

In FIG. 9, the red colored light outputted from the red subpixel SPr having the red color filter pattern 180R of a width of about 2.6 μm has an intensity peak of about 0.16 at a wavelength of about 620 nm, and the red colored light outputted from the red subpixel SPr having the red color filter pattern 180R of a width of about 2.1 μm has an intensity peak of about 0.14 at a wavelength of about 620 nm. As a result, the red colored light through the red color filter pattern 180R of a width about 2.6 μm and the red colored light through the red color filter pattern 180R of a width about 2.1 μm have the intensity peak at the same wavelength, and the intensity the red colored light through the red color filter pattern 180R of a width about 2.1 μm decreases as compared with the intensity the red colored light through the red color filter pattern 180R of a width about 2.6 μm.

Here, the red colored light through the red color filter pattern 180R of a width about 2.6 μm and the red colored light through the red color filter pattern 180R of a width about 2.1 μm have substantially the same intensity peak width as each other. As a result, a light leakage through the red color filter pattern 180R is not caused even when the width of the red color filter pattern 180R is reduced.

Although the intensity of the light is minutely reduced as the width of the color filter pattern is reduced, deterioration such as a light leakage due to reduction of the width is not caused. Further, the reduction of the intensity due to the reduction of the width is minute as compared with increase of the intensity and the efficiency due to the air layer 182. As a result, when the air layer 182 is formed by reducing the width of the color filter pattern, the intensity and the efficiency are improved and deterioration such as a light leakage is prevented.

Figure 10:
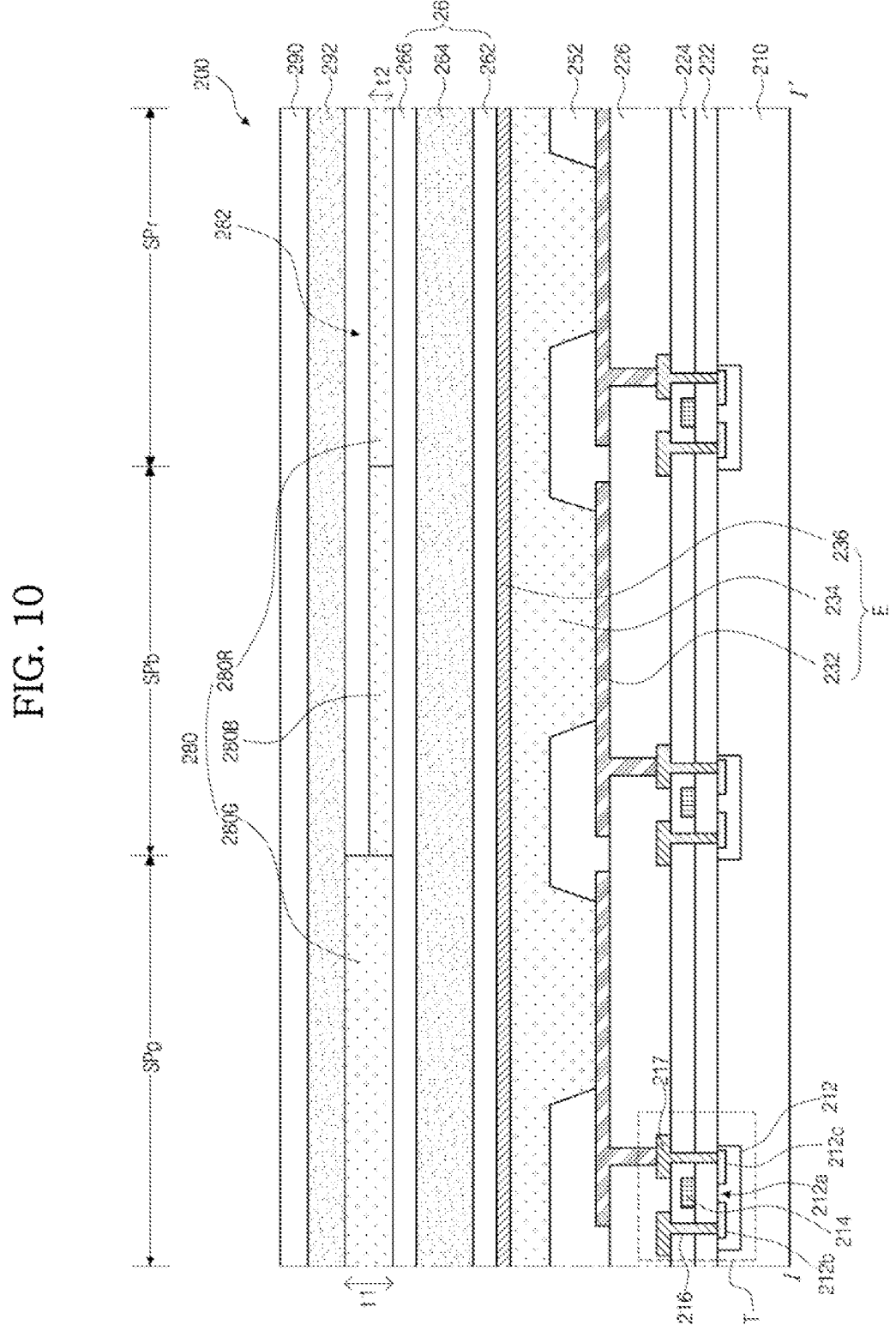
FIG. 10 is a cross-sectional view showing an organic light emitting diode display device according to a second aspect of the present disclosure.

FIG. 10 is a cross-sectional view showing an organic light emitting diode display device according to a second aspect of the present disclosure. Illustration on a part the same as a part of a first aspect may be omitted.

In an organic light emitting diode (OLED) display device 200 according to a second aspect of the present disclosure, thicknesses of two of red, green and blue color filter patterns 280R, 280G and 280B is smaller than a thickness of the other one of the red, green and blue color filter patterns 280R, 280G and 280B. As a result, an air layer is disposed on the two of the red, green and blue color filter patterns 280R, 280G and 280B. The thicknesses of the red and blue color filter patterns 280R and 280B are exemplarily smaller than the thickness of the green color filter pattern 280G in a second aspect.

In another aspect, the thicknesses of the green and blue color filter patterns 280G and 280B may be exemplarily smaller than the thickness of the red color filter pattern 280R, or the thicknesses of the red and green color filter patterns 280R and 280G may be exemplarily smaller than the thickness of the blue color filter pattern 280B.

In another aspect, the thickness of one of the red, green and blue color filter patterns 280R, 280G and 280B may be smaller than the thicknesses of the other two of the red, green and blue color filter patterns 280R, 280G and 280B.

In FIG. 10, the OLED display device 200 according to a second aspect of the present disclosure includes a transistor T in each of red, green and blue subpixels SPr, SPg and SPb on a wafer substrate 210. The wafer substrate 210 may be a single crystalline silicon wafer. The transistor T includes an active layer 212 in the wafer substrate 210, a gate insulating layer 222 on the wafer substrate 210, a gate electrode 214 on the gate insulating layer 222, an interlayer insulating layer 224 on the gate electrode 214 over the gate insulating layer 222 and source and drain electrodes 216 and 217 on the interlayer insulating layer 224. The active layer 212 may have a channel region 212a not doped with an impurity and at a central portion thereof and source and drain regions 212b and 212c doped with an impurity and at both sides of the channel region 212a.

A passivation layer 226 may be disposed on the transistor T over the wafer substrate 210, and a bank layer 252 is disposed at a boundary portion of each subpixel.

A light emitting diode E is disposed on the passivation layer 226.

The light emitting diode E includes a first electrode 232, an emitting layer 234 and a second electrode 236. The first electrode 232 is exposed through an opening of the bank layer 252 and is connected to a drain electrode 217 of the transistor T through a contact hole in the passivation layer 226. The emitting layer 234 is disposed on the first electrode 232 and the bank layer 252, and the second electrode 236 is disposed on the emitting layer 234.

An encapsulating layer 260 is disposed on the light emitting diode E. The encapsulating layer 260 may include a first encapsulating layer 262 of an inorganic material, a second encapsulating layer 264 of an organic material and a third encapsulating layer 266 of an inorganic material.

A color filter layer 280 is disposed on the encapsulating layer 260. The color filter layer 280 includes red, green and blue color filter patterns 280R, 280G and 280B in the red, green and blue subpixels SPr, SPg and SPb, respectively.

The green color filter pattern 280G has a first thickness t1, and each of the blue and red color filter patterns 280B and 280R has a second thickness t2 smaller than the first thickness t1. (t1>t2) When the color filter layer 280 is disposed on the encapsulating layer 260, the green color filter pattern 280G is formed to have the first thickness t1, and the blue and red color filter patterns 280B and 280R are each formed to have the second thickness t2 smaller than the first thickness t1. As a result, a vacant space, i.e., an air layer 282 is disposed on the blue and red color filter patterns 280B and 280R.

Since the green color filter pattern 280G has the first thickness t1 greater than the second thickness t2 of the blue and red color filter patterns 280B and 280R, a side surface of an upper portion (corresponding to a region of t1-t2) of the green color filter pattern 280G contacts the air layer 282 on the blue and red color filter patterns 280B and 280R.

An adhesive layer 292 such as an optical clear adhesive (OCA) is disposed on the color filter layer 280, and a protecting layer 290 is disposed on the adhesive layer 292 such that the protecting layer 290 is attached to the color filter layer 280 due to the adhesive layer 292.

In the OLED display device 200 according to a second aspect of the present disclosure, since the air layer 282 is disposed on some (e.g., blue and red color filter patterns 280B and 280R) of the red, green and blue color filter patterns 280R, 280G and 280B, a light efficiency of the red, green and blue subpixels SPr, SPg and SPb is improved.

Figure 11:
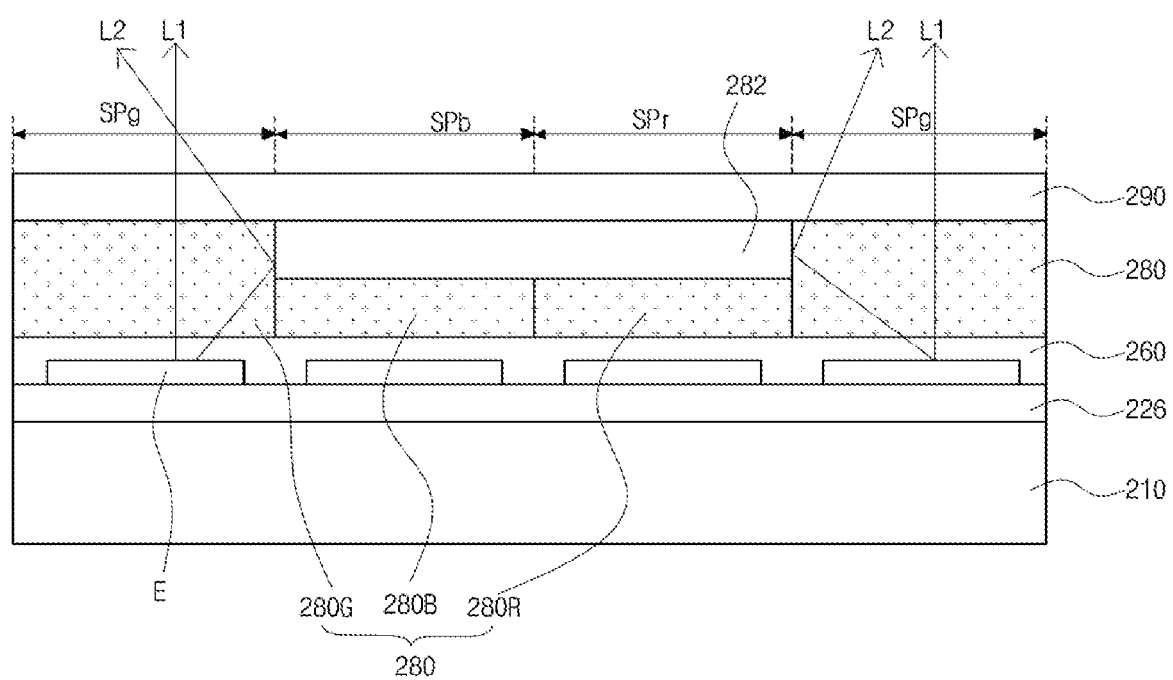
FIG. 11 is a cross-sectional view showing a light path in an organic light emitting diode display device according to a second aspect of the present disclosure.

FIG. 11 is a cross-sectional view showing a light path in an organic light emitting diode display device according to a second aspect of the present disclosure.

In FIG. 11, the color filter layer 280 includes the red, green and blue color filter patterns 280R, 280G and 280B in the red, green and blue subpixels SPr, SPg and SPb, respectively, and the air layer 282 is disposed on the blue and red color filter patterns 280B and 280R. The air layer 282 is disposed between the upper portions of the green color filter patterns 280G.

In the OLED display device 200 according to a second aspect of the present disclosure, a white colored light emitted from the light emitting diode E of the red, green and blue subpixels SPr, SPg and SPb is outputted through the color filter layer 280. For example, the red color filter pattern 280R may absorb a light of a wavelength band other than a wavelength of the red colored light among the white colored light to output the red colored light. The green color filter pattern 280G may absorb a light of a wavelength band other than a wavelength of the green colored light among the white colored light to output the green colored light, and the blue color filter pattern 280B may absorb a light of a wavelength band other than a wavelength of the blue colored light among the white colored light to output the blue colored light.

First lights L1 perpendicularly emitted from the light emitting diode E of the red, green and blue subpixels SPr, SPg and SPb may be outputted through the red, green and blue color filter patterns 280R, 280G and 280B, respectively.

A second light L2 obliquely emitted from the light emitting diode E of the green subpixel SPg may pass through the green color filter pattern 280G to reach a side surface of the upper portion of the green color filter pattern 280G. The air layer 282 is disposed on the blue and red color filter patterns 280B and 280R to contact the side surface of the upper portion of the green color filter pattern 280G.

Since a refractive index of an organic material of the color filter layer 280 is greater than a refractive index of an air of the air layer 282, the second light L2 reaching the side surface of the upper portion of the green color filter pattern 280G do not pass through the air layer 282 and are totally reflected at the side surface of the upper portion of the green color filter pattern 280G. As a result, the second light L2 totally reflected at the side surface of the upper portion of the green color filter pattern 280G is outputted from the green subpixel SPg.

Accordingly, in the OLED display device 200 according to a second aspect of the present disclosure, since the light emitted from the light emitting diode E of the subpixel does not permeate into the adjacent subpixel and is outputted through the corresponding color filter pattern, deterioration due to a color mixture of the adjacent subpixels is prevented and a luminance of the corresponding subpixel increases.

Figure 12:
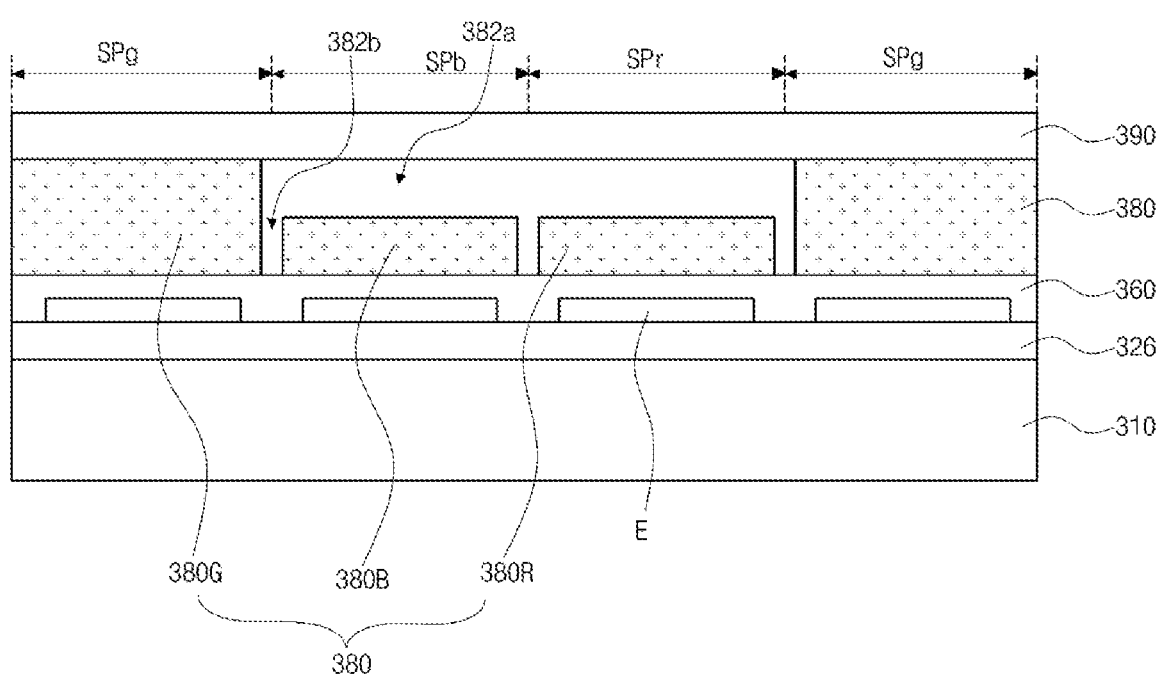
FIG. 12 is a cross-sectional view showing an organic light emitting diode display device according to a third aspect of the present disclosure.

FIG. 12 is a cross-sectional view showing an organic light emitting diode display device according to a third aspect of the present disclosure.

In FIG. 12, a light emitting diode E is disposed in each of red, green and blue subpixels SPr, SPg and SPb on a wafer substrate 310, and an encapsulating layer 360 is disposed on the light emitting diode E.

A color filter layer 380 is disposed on the encapsulation layer 360, and a protecting layer 390 is disposed on the color filter layer 380 with an adhesive layer interposed therebetween.

The color filter layer 380 includes red, green and blue color filter patterns 380R, 380G and 380B in the red, green and blue subpixels SPr, SPg and SPb, respectively. One or two of the red, green and blue color filter patterns 380R, 380G and 380B may have a first thickness, and the other one or two of the red, green and blue color filter patterns 380R, 380G and 380B may have a second thickness smaller than the first thickness. As a result, a first air layer 382a is disposed on the other one or two of the red, green and blue color filter patterns 380R, 380G and 380B having the second thickness.

Further, a vacant space where the red, green and blue color filter patterns 380R, 380G and 380B are not formed, i.e., a second air layer 382b filled with an air, is disposed in a boundary portion of the red, green and blue subpixels SPr, SPg and SPb between the red, green and blue color filter patterns 380R, 380G and 380B. The first air layer 382a on the color filter pattern having the second thickness and the second air layer 382b between upper portions of the color filter pattern having the first thickness may be circulated to each other.

In the OLED display device according to a third aspect of the present disclosure, since the light obliquely emitted from the light emitting diode E of the subpixel is totally reflected at an interface between the corresponding color filter pattern and the air layer such as the first and second air layers 382a and 382b to be outputted through the corresponding color filter pattern, deterioration due to a color mixture of the adjacent subpixels is prevented and a luminance of the corresponding subpixel increases.

Consequently, in the OLED display device according to the present disclosure, since the black matrix is not disposed between the color filter patterns, a subminiature display device of a relatively high resolution is obtained.

Further, the air layer is disposed between the color filter patterns, and the light is totally reflected at the interface between the color filter pattern and the air layer to be outputted through the corresponding color filter pattern. As a result, the luminance of the corresponding subpixel increases and the light efficiency is improved.

It will be apparent to those skilled in the art that various modifications and variation can be made in the present disclosure without departing from the scope of the disclosure. Thus, it is intended that the present disclosure cover the modifications and variations of this disclosure provided they come within the scope of the appended claims.

What is claimed is:

1. A display device comprising:
   a substrate including first, second and third subpixels;
   a light emitting diode disposed in each of the first, second and third subpixels on the substrate;
   a color filter layer disposed on the light emitting diode and including first, second and third color filter patterns in the first, second and third subpixels, respectively; and
   an air layer disposed in the color filter layer,
   wherein at least one of the first, second and third color filter patterns has a first thickness and other one or two of the first, second and third color filter patterns has a second thickness smaller than the first thickness, and
   wherein the air layer is disposed on the other one or two of the first, second and third color filter patterns having the second thickness to contact a side surface of the at least one of the first, second and third color filter patterns having the first thickness.

2. The display device of claim 1, wherein the substrate includes a semiconductor wafer.

3. The display device of claim 2, further comprising a transistor in each of the first, second and third subpixels on the substrate,
   wherein the transistor comprises:
   an active layer disposed in the substrate;
   a gate insulating layer disposed on the active layer;
   a gate electrode disposed on the gate insulating layer;
   an interlayer insulating layer disposed on the gate electrode;
   a source electrode and a drain electrode disposed on the interlayer insulating layer; and
   a passivation layer disposed on the source electrode and the drain electrode.

4. The display device of claim 1, further comprising an encapsulating layer on the light emitting diode.

5. The display device of claim 4, wherein the encapsulating layer comprises:
   a first encapsulating layer disposed on the light emitting diode;
   a second encapsulating layer disposed on the first encapsulating layer; and
   a third encapsulating layer disposed on the second encapsulating layer.

6. The display device of claim 1, wherein the light emitting diode comprises:
   a first electrode disposed on the substrate;
   an emitting layer disposed on the first electrode; and
   a second electrode disposed on the emitting layer.

7. The display device of claim 6, wherein the emitting layer emits white colored light.

8. The display device of claim 1, wherein the first, second and third subpixels correspond to red, green and blue subpixels, respectively.

9. The display device of claim 3, wherein the transistor includes a single crystalline silicon.

10. The display device of claim 1, further comprising an adhesive layer disposed on the color filter layer and a protecting layer disposed on the adhesive layer,
   wherein the protecting layer is attached to the color filter layer through the adhesive layer.

11. The display device of claim 10, wherein the adhesive layer includes an optical clear adhesive as a semisolid state.

12. The display device of claim 1, wherein the at least one of the first, second and third color filter patterns includes a green color filter pattern, and the another one or two of the first, second and third color filter patterns includes a blue color filter pattern and a red color filter pattern.

13. The display device of claim 6, further comprising a bank layer disposed at a boundary portion of each of the first, second and third subpixels, wherein the bank layer is a sidewall defining the first, second and third subpixels and divides the first, second and third subpixels, and wherein the emitting layer contacts a side surface and a top surface of the bank layer and has a flat top surface.

* * * * *